(12) United States Patent
Koide

(10) Patent No.: US 10,095,074 B2
(45) Date of Patent: Oct. 9, 2018

(54) DISPLAY DEVICE

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/647,637

(22) Filed: Jul. 12, 2017

(65) Prior Publication Data

US 2018/0024405 A1   Jan. 25, 2018

(30) Foreign Application Priority Data

Jul. 20, 2016   (JP) ................................ 2016-142515

(51) Int. Cl.
| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *G02F 1/1343* | (2006.01) | |
| *G02F 1/1362* | (2006.01) | |
| *G02F 1/1368* | (2006.01) | |
| *H01L 29/786* | (2006.01) | |
| *H01L 29/423* | (2006.01) | |
| *H01L 27/12* | (2006.01) | |

(52) U.S. Cl.
CPC ...... *G02F 1/134363* (2013.01); *G02F 1/1368* (2013.01); *G02F 1/136286* (2013.01); *G02F 1/136227* (2013.01); *G02F 2001/13685* (2013.01); *G02F 2001/134345* (2013.01); *G02F 2001/134372* (2013.01); *G02F 2201/123* (2013.01); *G02F 2201/52* (2013.01); *G02F 2202/10* (2013.01); *H01L 27/124* (2013.01); *H01L 29/42384* (2013.01); *H01L 29/78696* (2013.01)

(58) Field of Classification Search
CPC .... G02F 1/1343; G02F 1/1362; G02F 1/1368; G02F 1/1335; G02F 1/1333; G02F 1/133514; G02F 1/134363; G02F 2001/134372; G02F 2201/52
See application file for complete search history.

(56) References Cited

U.S. PATENT DOCUMENTS

| | | | |
|---|---|---|---|
| 9,606,381 B2 | 3/2017 | Yamaguchi et al. | |
| 2008/0284929 A1* | 11/2008 | Kimura ............... | G02F 1/13624 349/38 |
| 2015/0234243 A1 | 8/2015 | Oono et al. | |

FOREIGN PATENT DOCUMENTS

JP   2015-155953   8/2015

* cited by examiner

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

According to one embodiment, a display device includes a first subpixel and a second subpixel. An area, in a plan view, surrounded by a first signal line, a second signal line, a first scanning line, and a second scanning line and including a first pixel electrode is a first area. An area, in a plan view, surrounded by the first signal line, the second signal line, the second scanning line, and a third scanning line and including a second pixel electrode is a second area. The first area has a first distance in the first direction and the second area has a second distance in the first direction. The first distance is greater than the second distance.

16 Claims, 9 Drawing Sheets

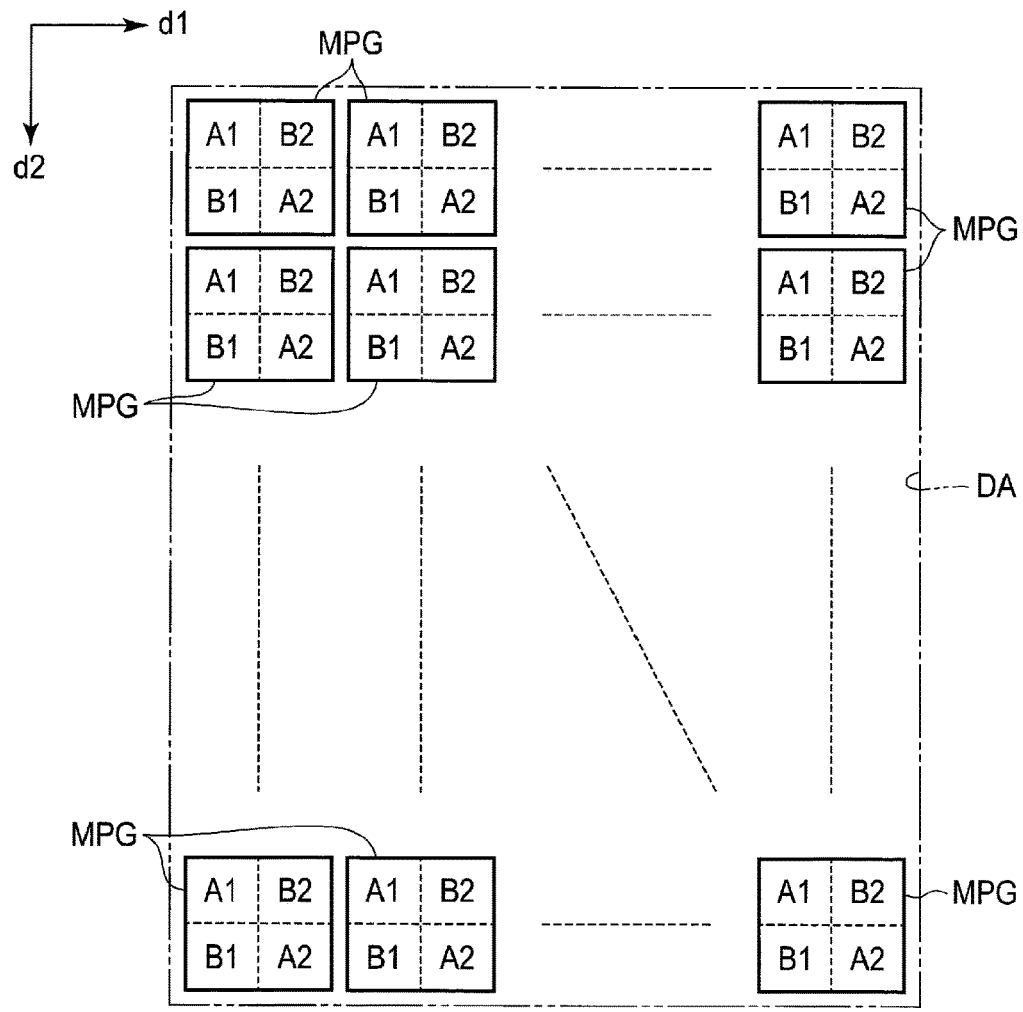
F I G. 3

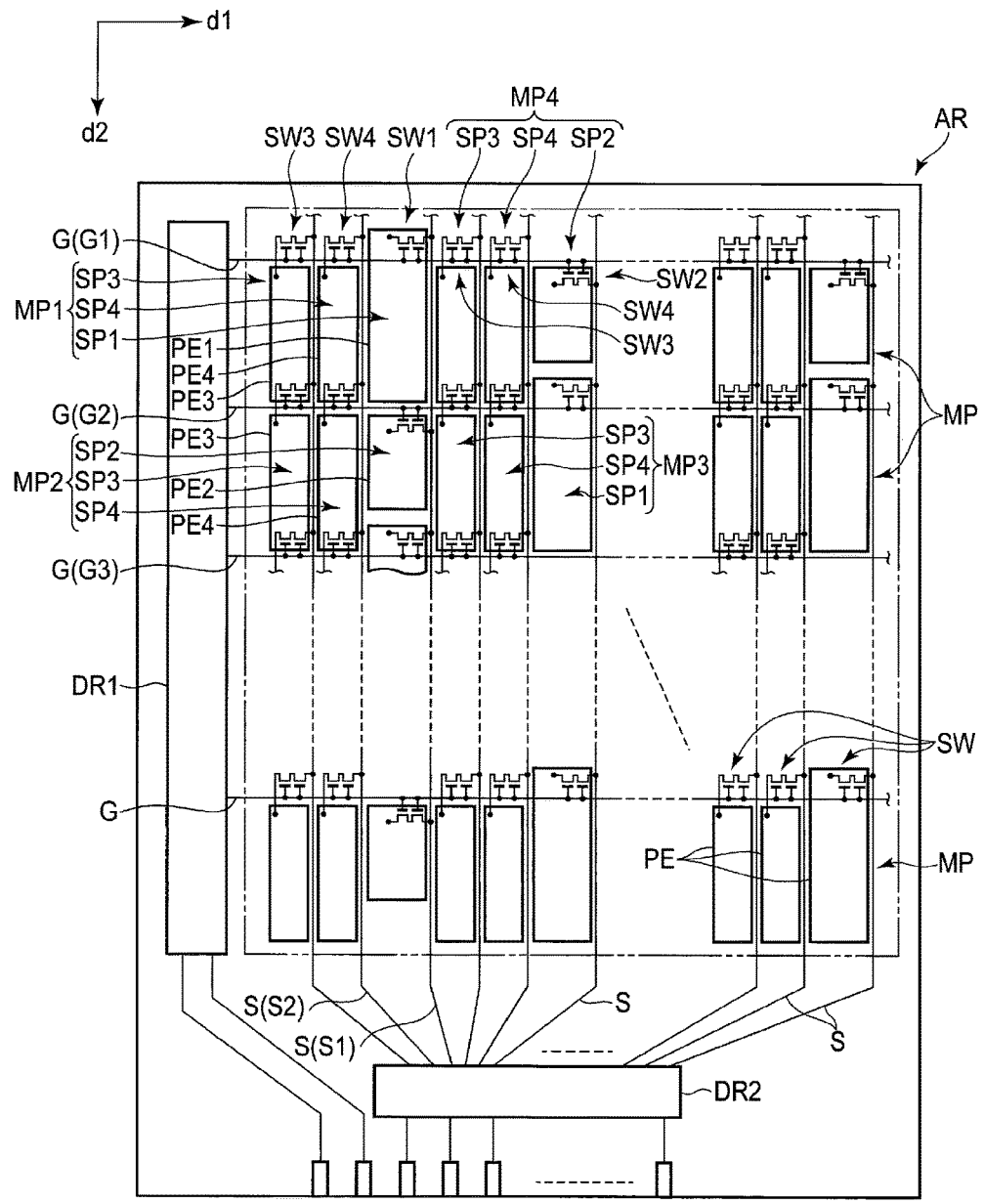
F I G. 5

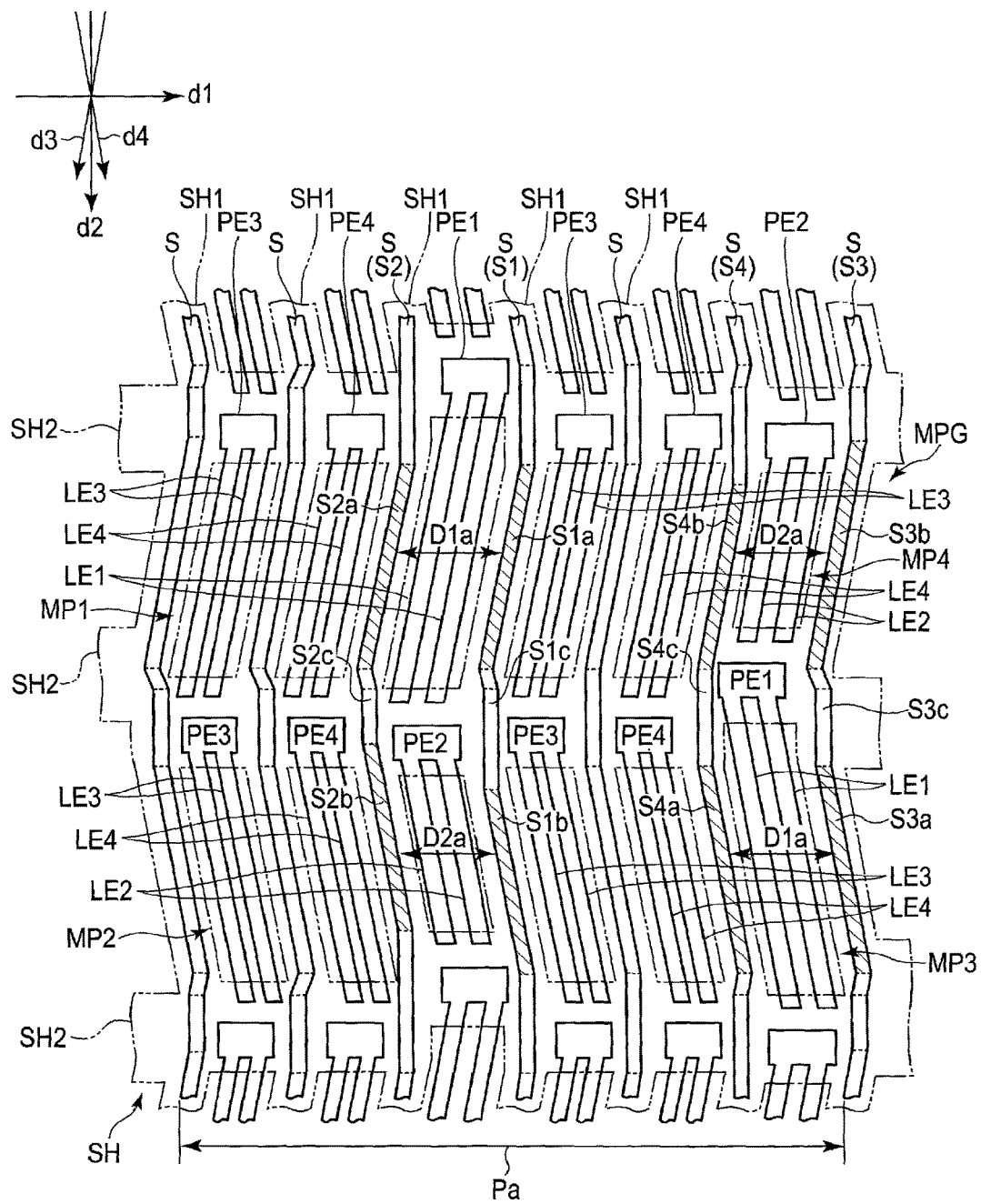
F I G. 6

DISPLAY DEVICE

CROSS-REFERENCE TO RELATED APPLICATIONS

This application is based upon and claims the benefit of priority from Japanese Patent Application No. 2016-142515, filed Jul. 20, 2016, the entire contents of which are incorporated herein by reference.

FIELD

Embodiments described herein relate generally to a display device.

BACKGROUND

In recent years, display devices used for smartphones, tablets, and the like are required to have greater resolution performance and greater aperture ratio. For example, a third color (R) subpixel, a fourth color (G) subpixel, and a second color (W) subpixel are arranged in an optional row in this order, and a third color subpixel, a fourth color subpixel, and a first color (B) subpixel are arranged in a next row in this order. A plurality of third color subpixels are arranged in the same column and a plurality of fourth color subpixels are arranged in the same column. The first subpixel and the second subpixel are arranged in the same column. For example, each width of the third color subpixel and the fourth color subpixel can be set greater than each width of the first color subpixel and the second color subpixel.

However, when the width of the first color subpixel becomes greater, the width of the second color subpixel becomes greater accordingly. Thus, arranging subpixels having different widths along signal lines is difficult to achieve.

BRIEF DESCRIPTION OF THE DRAWINGS

FIG. 3 shows an example of the arrangement of pixel groups in a display area of the liquid crystal display panel.

FIG. 5 is a circuit diagram of the structure of an array substrate shown in FIGS. 1 and 2.

FIG. 6 is a schematic view of one pixel group in the liquid crystal display panel and a plan view showing signal lines, pixel electrodes, and a light shielding layer.

DETAILED DESCRIPTION

Figure 1:
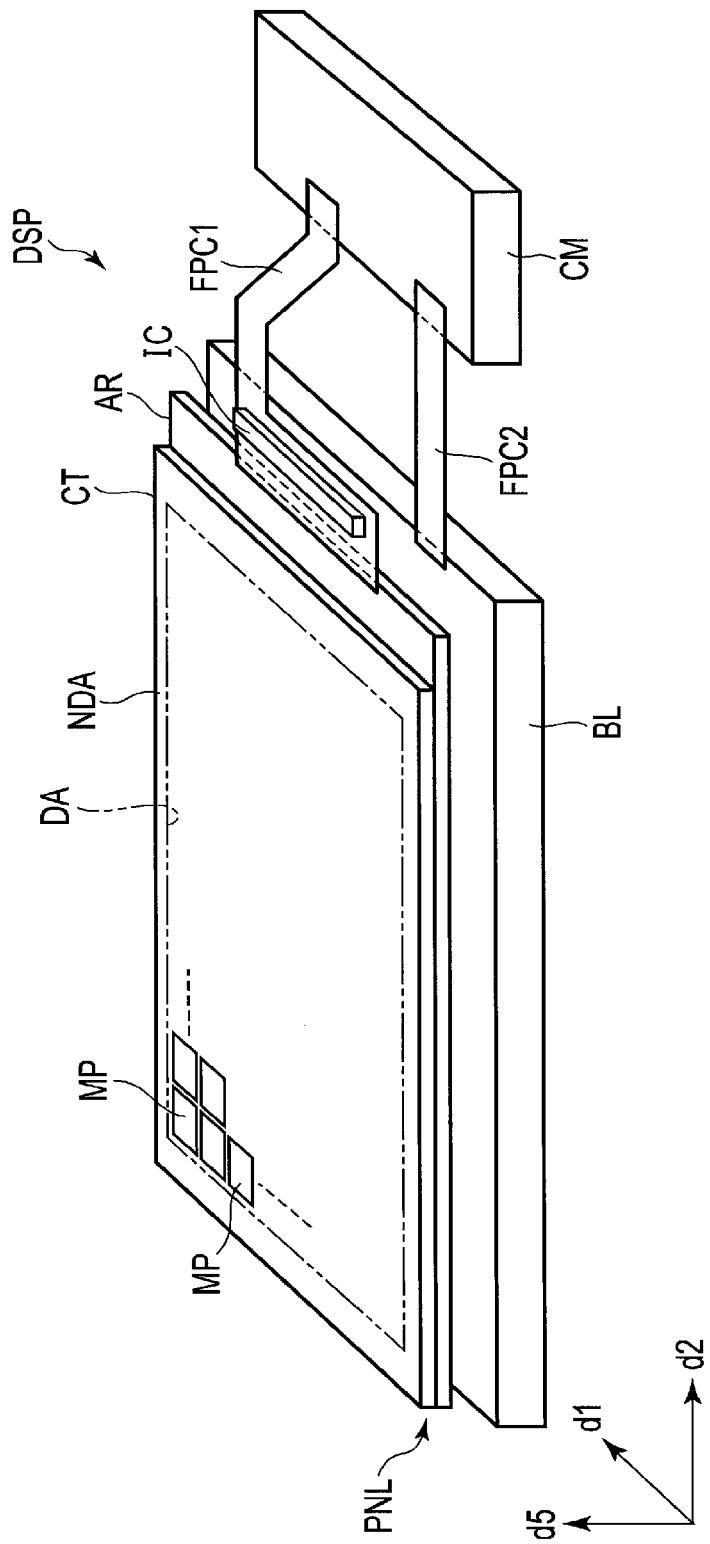
FIG. 1 is a perspective view of the structure of a liquid crystal display device of an embodiment.

In general, according to one embodiment, there is provided a display device, comprising: a first signal line; a second signal lines arranged in a first direction to be apart from the first signal line; a first scanning line; a second scanning line and a third scanning line arranged in a second direction which crosses the first direction to be apart from the first scanning line; and a first subpixel including a first pixel electrode and a second subpixel including a second pixel electrode, wherein an area, in a plan view, surrounded by the first signal line, the second signal line, the first scanning line, and the second scanning lines and including the first pixel electrodes is a first area, an area, in a plan view, surrounded by the first signal line, the second signal line, the second scanning line, and the third scanning lines and including the second pixel electrode is a second area, the first area has a first distance in the first direction and the second area has a second distance in the first direction, and the first distance is greater than the second distance.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

The liquid crystal display devices of the present embodiment can be used in various devices such as smartphones, tablets, mobile phones, personal computers, television receivers, in-car devices, and gaming devices.

FIG. 1 is a perspective view of the structure of a liquid crystal display device DSP. In the present embodiment, a first direction d1 and a second direction d2 are orthogonal to each other. A fifth direction d5 is orthogonal to each of the first direction d1 and the second direction d2. The directions mentioned here are directions of arrows in the figure, and the directions reversed 180 degrees with respect to the arrows are opposite directions. Note that the first direction d1 and the second direction d2 may cross at an angle other than 90 degrees.

As shown in FIG. 1, the liquid crystal display device DSP includes, for example, an active matrix liquid crystal display panel PNL, backlight unit BL used for illuminating the liquid crystal display panel PNL, flexible printed circuits FPC1 and FPC2, and driver IC chip IC. The flexible printed circuits FPC1 and FPC2 are connected to the liquid crystal display device or a control module CM disposed outside the liquid crystal display device.

In the following description, the direction from the backlight unit BL to the liquid crystal display panel PNL will be defined as above (or up). The direction from the liquid crystal display panel PNL to the backlight unit BL will be defined as below (or down). Furthermore, phrases such as "a second member above a first member" and "a second member below a first member" may refer to either a case where the second member contacts the first member or a case where the second member is apart from the first member. In the latter case, a third member may be interposed between the first and second members.

The liquid crystal display panel PNL includes an array substrate AR and a counter substrate CT opposed to the array substrate AR. The liquid crystal display panel PNL includes a display area DA for image display and a frame-like non-display area NDA surrounding the display area DA. The liquid crystal display panel PNL includes a plurality of main pixels arranged in a matrix in the first direction d1 and the second direction d2 in the display area DA. Hereinafter, a main pixel is referred to as a pixel MP. A pixel MP is equivalent to a group including three subpixels of four types of subpixels which will be described later.

The backlight unit BL is disposed in the rear surface of the array substrate AR. The backlight unit BL of various models can be adopted and its detailed structure will be omitted. The flexible printed circuit FPC1 connects the liquid crystal display panel PNL and the control module CM. The flexible printed circuit FPC2 connects the backlight unit BL and the control module CM. The driver IC chip IC is mounted on the flexible printed circuit FPC1.

The liquid crystal display device DSP structured as above corresponds to a transmissive liquid crystal display device which displays an image by selectively passing the light from the backlight unit BL incident on the liquid crystal display panel PNL in each subpixel. Note that the liquid crystal display device DSP may be a reflective liquid crystal display device which displays an image by selectively reflecting the external light incident on the liquid crystal display panel PNL, or a transreflective liquid crystal display device having both the transmissive function and the reflective function.

Figure 2:
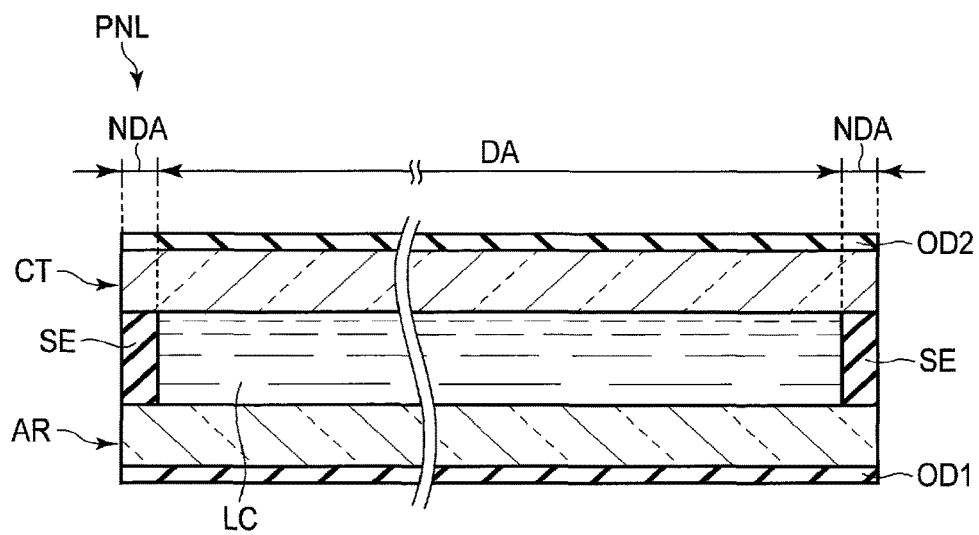
FIG. 2 is a cross-sectional view of a liquid crystal display panel of FIG. 1.

FIG. 2 is a cross-sectional view of the liquid crystal display panel PNL.

As shown in FIG. 2, the liquid crystal display panel PNL includes the array substrate AR, counter substrate CT, liquid crystal layer LC, sealing member SE, first optical element OD1, and second optical element OD2. The array substrate AR and the counter substrate CT will be described later.

The sealing member SE is disposed in the non-display area NDA to bond the array substrate AR and the counter substrate CT. The liquid crystal layer LC is held between the array substrate AR and the counter substrate CT. The first optical element OD1 is disposed on the surface of the array substrate AR opposite to its surface contacting the liquid crystal layer LC. The second optical element OD2 is disposed on the surface of the counter substrate CT opposite to its surface contacting the liquid crystal layer LC. The first optical element OD1 and the second optical element OD2 each include a polarizer. Note that the first optical element OD1 and the second optical element OD2 may include other optical elements such as a retardation plate.

FIG. 3 shows an example of the arrangement of main pixel groups in the display area DA of the liquid crystal display panel PNL. Hereinafter, the main pixel group will be referred to as pixel group MPG.

As shown in FIG. 3, the liquid crystal display panel PNL includes a plurality of pixel groups MPG.

The pixel groups MPG are arranged in a matrix in the first direction d1 and the second direction d2 in the display area DA. The pixel groups MPG each include four main pixels. Here, the pixel group MPG includes two types of pixels of first main pixels and second main pixels. In the present embodiment, the first main pixels are a first main pixel A1 and a first main pixel A2. The second main pixels are a second main pixel B1 and a second main pixel B2. In any pixel group MPG, the first main pixel A1, first main pixel A2, second main pixel B1, and second main pixel B2 are arranged in the same manner. The first main pixels A1 and A2, and the second main pixels B1 and B2 are arranged in a checkerboard pattern in the first direction d1 and the second direction d2. Note that the structure of the first main pixels A1 and A2 and the second main pixels B1 and B2 will be described later.

In pixels, first main pixels A1 and second main pixels B2 are arranged alternately in one side and second main pixels B1 and first main pixels A2 are arranged alternately in the other side in the first direction d1. First main pixels A1 and second main pixels B1 are arranged alternately in one side and second main pixels B2 and first main pixels A2 are arranged alternately in the other side in the second direction d2. The first main pixels A1 and A2 and the second main pixels B1 and B2 are arranged such that the pixels of the same type do not continue in either the first direction d1 or the second direction d2.

Figure 4:
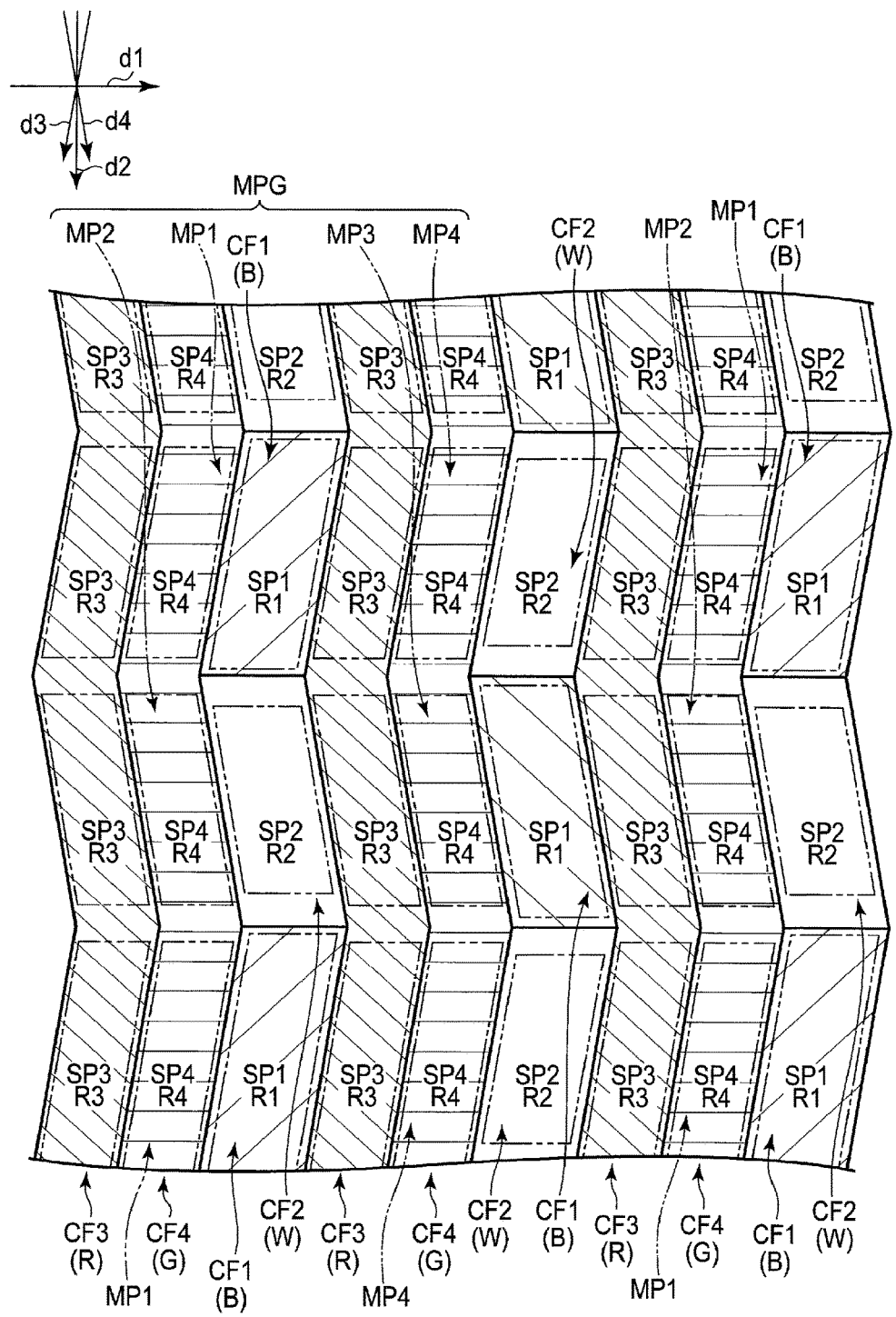
FIG. 4 shows a part of the pixel groups and an example of the arrangement of pixels in the pixel groups.

FIG. 4 shows an example of the arrangement of the pixel groups MPG. In FIG. 4, four pixels MP of a pixel group MPG and pixels MP surrounding the four pixels MP are shown.

As shown in FIG. 4, a pixel group MPG includes a first pixel MP1, second pixel MP2, third pixel MP3, and fourth pixel MP4. The first pixel MP1 corresponds to the first main pixel A1, the second pixel MP2 corresponds to the second main pixel B1, the third pixel MP3 corresponds to the first main pixel A2, and the fourth pixel MP4 corresponds to the second main pixel B2.

The first pixel MP1 and the third pixel MP3 each include three subpixels SP of a first color subpixel SP1, third color subpixel SP3, and fourth color subpixel SP4. The second pixel MP2 and fourth pixel MP4 each include three subpixels SP of a second color subpixel SP2, third color subpixel SP3, and fourth color subpixel SP4. Note that the first, second, third, and fourth colors are different from each other.

The first color subpixel SP1 includes a region R1 of first color and a color filter CF1 of first color. The second color subpixel SP2 includes a region R2 of second color and a color filter CF2 of second color. The third color subpixel SP3 include a region R3 of third color and a color filter CF3 of third color. The fourth color subpixel SP4 includes a region R4 of fourth color and a color filter CF4 of fourth color. Note that the regions R1 to R4 are depicted with two-dotted chain lines in the figure. Each of the regions R1 to R4 can be interpreted as an opening area of the subpixels SP. Or, each of the regions R1 to R4 can be interpreted as a region which is not opposed to a signal line S or a light shielding layer SH which will be described later. Furthermore, the region R1 may be referred to as a first region, the region R2 may be referred to as a second region, the region R3 may be referred to as a third region, and the region R4 may be referred to as a fourth region.

In the first direction d1, the regions R3, R4, R1, R3, R4, and R2 are arranged alternately. In the first pixels MP1 and the second pixels MP2 arranged in the second direction d2, the regions R3 are arranged in the second direction d2, and the regions R4 are arranged in the second direction d2, and the regions R1 and the regions R2 are arranged in the second direction d2. In the third pixels MP3 and the fourth pixels MP4 arranged in the second direction d2, the regions R3 are arranged in the second direction d2, the regions R4 are arranged in the second direction d2, and the regions R1 and the regions R2 are arranged in the second direction d2.

The regions R1 to R4 are each shaped as a substantial parallelogram. The color filters CF1 to CF4 are arranged to correspond to the layout of the subpixels SP and have an area corresponding to size of their subpixels SP. The color filters CF1 and CF2 are arranged alternately in the second direction d2. The color filter CF1 is opposed to the region R1, and the color filter CF2 is opposed to the region R2. The color filter CF3 is opposed to the regions R3 arranged in the second direction d2 and extend along the regions R3. The color filter CF4 is opposed to the regions R4 arranged in the second direction d2 and extend along the regions R4.

In the present embodiment, the first color is blue (B), the second color is white (W), the third color is red (R), and the fourth color (G). For example, the color filter CF2 is a transparent or pale color filter. The color filter CF2 is substantially transparent and may preferably be referred to a non-color filter. However, the first to fourth colors are merely examples and may be varied. As long as the first to fourth colors include blue, white, green, and red, the color application is optional. Furthermore, the first to fourth colors are not limited to the combination of blue, white, green, and red. Furthermore, the second color and the color filter CF2 may be, instead of white, any color different from blue, green, and red.

In the present application, for example, light of wavelength between 380 and 780 nm is defined as visible light. The first color is blue and defined as light of wavelength which is 380 or more and less than 490 nm. The second color is white. The third color is red and defined as light of wavelength which is 590 or more and less than 780 nm. The fourth color is green and defined as light of wavelength which is 490 or more and less than 590 nm. The phrase "substantially transparent" may refer to a case of non-color and a case of pale color of any visible light.

In the second direction d2, the region R3 and the region R4 of each pixel MP have substantially the same length. In the second direction d2, the region R1 of the first pixel MP1 and the region R1 of the third pixel MP3 have substantially the same length. In the second direction d2, the region R1 of the second pixel MP2 and the region R1 of the fourth pixel MP4 have substantially the same length.

The regions R1 of the first pixel MP1 and the third pixel MP3 have substantially the same width in the first direction d1, which is a first width. The regions R2 of the second pixel MP2 and the fourth pixel MP4 have substantially the same width in the first direction d1, which is a second width. The regions R3 of each pixel MP have substantially the same width in the first direction d1, which is a third width. The regions R4 of each pixel MP have substantially the same width in the first direction d1, which is a fourth width.

The first width is greater than the second width. As mentioned above, as long as the first width is greater than the second width, the size relationship between the first to fourth widths is not limited specifically. In the present embodiment, the third width is greater than the fourth width, and the second width is greater than the third width.

The regions R1 of the first pixel MP1 and the third pixel MP3 have substantially the same area, which is a first area. The regions R2 of the second pixel MP2 and the fourth pixel MP4 have substantially the same area, which is a second area. The regions R3 of each pixel MP have substantially the same area, which is a third area. The regions R4 of each pixel MP have substantially the same area, which is a fourth area.

The size relationship between the first to fourth areas is not limited specifically. In the present embodiment, the third area is greater than the fourth area, and the second area is greater than the third area, and the first area is greater than the second area.

With the pixels MP structured as above, as compared to a case where the entire pixels MP are four subpixels of red (R), green (G), blue (B), and white (W), the number of subpixels SP of the pixel groups MPG can be reduced. Thereby, the aperture ratio of the subpixels SP can be increased without decreasing the resolution performance. Furthermore, since each pixel group MPG includes a white (W) subpixel SP, the brightness level of the displayed image can be increased.

Furthermore, in the present embodiment, in the regions R1 to R4, since the ratio of the region R1 of first color (blue) is increased, the light transmissivity of the region R1 can be increased and it helps lower power consumption. Since the first width of the regions R1 is increased, the second width of the regions R2 of second color (white) is prevented from increasing together. The third width of the regions R3 and the fourth width of the regions R4 do not decrease together, the ratio of the area of the regions R3 and the ratio of the area of the regions R4 are prevented from decreasing.

The regions R and color filters CF extend in at least one direction of the third direction d3 and the fourth direction d4. Here, the third direction d3 is a direction inclined in a first rotation direction at an acute angle with respect to the second direction d2. The fourth direction d4 is a direction inclined in a second rotation direction which is opposite to the first rotation direction at an acute angle with respect to the second direction d2. In the present embodiment, the first rotation direction goes right and the second rotation direction goes left. However, unlike the present embodiment, the first rotation direction may go left and the second rotation direction may go right.

As can be understood from the above, the present embodiment can compensate view angle characteristics as compared to a case where the regions R have a rectangular shape extending in the second direction d2. Thus, the present embodiment can achieve wider view angle of the liquid crystal display panel PNL.

In the pixel group MPG, a lack of first color (blue) in the second pixel MP2 and the fourth pixel MP4 can be covered by at least one of the first pixel MP1 and the third pixel MP3. Therefore, each of the pixels MP can simulatively display a color image.

In a plan view, the arrangement direction of liquid crystal molecules in the electrical field of the region R1 of the first pixel MP1 and the arrangement direction of liquid crystal molecules in the electrical field of the region R1 of the third pixel MP3 may have a reverse relationship with respect to the second direction d2. Thus, view angle dependency of chromaticity in the first direction d1 (horizontal direction) can be decreased. Therefore, the image with the same chromaticness can be achieved for a user viewing the screen from the left side and a user viewing the screen from the right side.

FIG. 5 is a plan view of the structure of the array substrate AR.

As shown in FIG. 5, the array substrate AR includes, for example, a scanning lines G, signal lines S, pixel electrodes PE, switching elements SW, first driver circuit DR1, and second driver circuit DR2.

A plurality of scanning lines G extend in the first direction d1 and are arranged at intervals in the second direction d2 in the display area DA. For example, a second scanning line G2 and a third scanning line G3 are arranged at intervals from a first scanning line G1 in the second direction d2. In the present embodiment, scanning lines G extend linearly in the first direction d1. A plurality of signal lines S extend in the second direction d2, cross the scanning lines G, and are arranged at intervals in the first direction d1 in the display area DA. Note that the signal lines S do not necessarily extend linearly, and may partly bent or may be extended in directions which cross in the first direction d1 and the second direction d2. In the present embodiment, the signal lines S bend and extend in the second direction d2, third direction d3, and fourth direction d4.

The first driver circuit DR1 and the second driver circuit DR2 are disposed in the non-display area NDA. The first driver circuit DR1 is electrically connected to the scanning lines G drawn to the non-display area NDA. The second driver circuit DR2 is electrically connected to the signal lines S drawn to the non-display area NDA. The first driver circuit DR1 outputs control signals to each scanning line G. The second driver circuit DR2 outputs image signals (for example, video signals) to each signal line S.

The first color subpixel SP1 includes a first switching element SW1 connected to a scanning line G and a first pixel electrode PE1 connected to a signal line S via the first switching element SW1. The second subpixel SP2 includes a second switching element SW2 connected to a scanning line G and a second pixel electrode PE2 connected to a signal line S via the second switching element SW2. The third color subpixel SP3 includes a third switching element SW3 connected to a scanning line G and a third pixel electrode PE3 connected to a signal line S via the third switching element SW3. The fourth color subpixel SP4 includes a fourth switching element SW4 connected to a scanning line G and a fourth pixel electrode PE4 connected to a signal line S via the fourth switching element SW4.

In the present embodiment, a plurality of switching elements SW of a plurality of subpixels SP arranged in the first direction d1 are connected to the same scanning line G. In a plan view, the region R1 is surrounded by a first signal line S1, second signal line S2, first scanning line G1, and second scanning line G2, and the first pixel electrode PE1 is formed therein. The region R2 is surrounded by the first signal line S1, second signal line S2, second scanning line G2, and third scanning line G3, and the second pixel electrode PE2 is formed therein.

FIG. 6 is a schematic view of one pixel group MPG and the like in the liquid crystal display panel PNL and is a plan view showing signal lines S, pixel electrodes PE, and a light shielding layer SH.

Note that, in the example depicted, the pixel MP has the structure corresponding to a fringe field switching (FFS) mode as its display mode and a common electrode is omitted from the depiction. While the signal lines S and the pixel electrode PE are formed in the array substrate, the light shielding layer SH is formed on the counter substrate. Note that the light shielding layer SH is depicted with two-dotted chain lines in the figure.

As shown in FIG. 6, the light shielding layer SH is shaped along the boundary of subpixel SP. The light shielding layer SH functions to block the light emitted from the backlight unit BL. The light shielding layer SH is formed of a material of highly optical absorption such as a black resin. Or, the light shielding layer SH is formed of a material of highly optical reflection such as a metal. The areas surrounded by the light shielding layer SH are the regions R1 to R4 which are used for image display. The light shielding layer SH includes a plurality of band-like first extensions SH1 and a plurality of band-like second extensions SH2. In the present embodiment, the first extensions SH1 and the second extensions SH2 are formed integrally.

The first extensions SH1 are opposed to signal lines S and extend along the signal lines S. As to the position of the first direction d1, the center line of the first extension SH1 and the center of the signal line S may match each other or may be shifted from each other.

For example, in the present embodiment, in the first extensions SH1, the part between the first pixel electrode PE1 and the third pixel electrode PE3 is shifted to be closer to the first pixel electrode PE1. In the first direction d1, the center of the part is disposed between the first pixel electrode PE1 and the center of the signal line S (S1 or S3).

Furthermore, in the first extensions SH1, the part between the second pixel electrode PE2 and the third pixel electrode PE3 is shifted to be closer to the second pixel electrode PE2. In the first direction d1, the center of the part is disposed between the second pixel electrode PE2 and the center of the signal line S (S1 and S3).

Furthermore, in the first extensions SH1, the part between the second pixel electrode PE2 and the fourth pixel electrode PE4 is shifted to be closer to the second pixel electrode PE2. In the first direction d1, the center of the part is disposed between the second pixel electrode PE2 and the center of the signal line S (S2 or S4).

As to the position of the first direction d1, the center of the pixel electrode PE may match the center of a pair of the signal lines S adjacent thereto. Or, by shifting the position of the pixel electrode PE, the center of the pixel electrode PE may match the middle of a pair of the first extensions SH1 adjacent thereto.

For example, in the present embodiment, the center of the first pixel electrode PE1 matches the middle of a pair of the first extensions SH1 adjacent thereto. The center of the second pixel electrode PE2 matches the middle of a pair of the first extensions SH1 adjacent thereto. The center of the third pixel electrode PE3 matches the center of a pair of signal lines S adjacent thereto. The center of the fourth pixel electrode PE4 matches the center of a pair of signal lines S adjacent thereto.

The second light shielding layers SH2 are opposed to the scanning lines G and extend along the scanning lines G. The second light shielding layers SH2 are opposed to the scanning lines G, ends of pixel electrodes PE, and switching elements SW. The both side edges of the second light shielding layer SH2 extend in the first direction d1 in a zigzag manner. The width of the second light shielding layer SH2 may not be constant. For example, the width of the second light shielding layer SH2 may expand in the area opposed to the color filters CF3 and CF4 between the first pixel MP1 and the second pixel MP2 and may be relatively narrowed in the area opposed to the color filters CF3 and CF4 between the third pixel MP3 and the fourth pixel MP4.

The first color subpixel SP1 includes one or more first linear electrodes LE1, the second color subpixel SP2 includes one or more second linear electrodes LE2, the third color subpixel SP3 includes one or more third linear electrodes LE3, and the fourth color subpixel SP4 includes one or more fourth linear electrodes LE4. As will be described later, in the present embodiment, the common electrode is disposed below the pixel electrodes PE. Thus, the pixel electrodes PE have the linear electrodes LE. In a case where the pixel electrodes PE are disposed below the common electrode, the common electrode has the linear electrodes, and the pixel electrodes PE are formed in a flat-plate shape.

In the present embodiment, the first pixel electrode PE1 includes a plurality of first linear electrodes LE1, the second pixel electrode PE2 includes a plurality of second linear electrodes LE2, the third pixel electrode PE3 includes a plurality of third linear electrodes LE3, and the fourth pixel electrode PE4 includes a plurality of fourth linear electrodes LE4. In the present embodiment, the number of the linear electrodes LE in the first pixel electrodes PE1, second pixel electrodes PE2, third pixel electrodes PE3, and fourth pixel electrodes PE4 is the same. Note that, unlike the present embodiment, the number of the linear electrodes LE may differ in pixel electrodes PE. For example, the number of the linear electrodes LE in the first pixel electrode PE1 and the second pixel electrode PE2 may be greater than the number of the linear electrodes LE in the third pixel electrode PE3 and the fourth pixel electrode PE4.

The linear electrodes LE of the first pixel MP1 and the fourth pixel MP4 extend in the third direction d3. The linear electrodes LE of the second pixel MP2 and the third pixel MP3 extend in the fourth direction d4. Here, in the signal lines S in the figure, signal lines S in the right side of the first pixel electrode PE1 of the first pixel MP1 and the second pixel electrode PE2 of the second pixel MP2 are referred to as first signal lines S1, and signal lines S in the left side thereof are referred to as second signal lines S2. Furthermore, signal lines S in the right side of the first pixel electrode PE1 of the third pixel MP3 and the second pixel electrode PE2 of the fourth pixel MP4 are referred to as third signal lines S3 and signal lines S in the left side thereof are referred to as fourth signal lines S4.

In the second direction d2, the first signal line S1 and the second signal line S2 define a first distance D1a in the first direction d1 passing the center of the first pixel electrode PE1 of the first pixel MP1, and in the second direction d2, the first signal line S1 and the second signal line G2 define a second distance D2a in the first direction d1 passing the center of the second pixel electrode PE2 of the second pixel MP2, wherein the first distance D1a is greater than the second distance D2a.

Note that the first distance D1a corresponds to a distance in the first direction d1 in the first area surrounded by the first signal line S1, second signal line S2, first scanning line G1, and second scanning line G2, and specifically, corresponds to a gap in the center of the first area in the second direction d2. The second distance D2a corresponds to a distance in the first direction d1 in the second area surrounded by the first signal line S1, second signal line S2, second scanning line G2, and third scanning line G3, and specifically, corresponds to a distance in the center of the second area in the second direction d2.

In the second direction d2, a distance in the first direction d1 between the third signal line S3 and the fourth signal line S4 passing the center of the first pixel electrode PE1 of the third pixel MP3 is the first distance D1a. In the second direction d2, a distance in the first direction d1 between the third signal lines S3 and the fourth signal lines S4 passing the center of the second pixel electrode PE2 of the fourth pixel MP4 is the second distance D2a.

The first signal line S1 includes a first extension S1a extending in parallel to the first linear electrode LE1 of the first pixel MP1, second extension S1b extending in parallel to the second linear electrode LE2 of the second pixel MP2, and first connection S1c connecting the first extension S1a and the second extension S1b. In the figure, the first extension S1a and second extension S1b, and a third extension S2a, fourth extension S2b, fifth extension S3a, sixth extension S3b, seventh extension S4a, and eighth extension S4b which will be described later are hatched.

The second signal line S2 includes a third extension S2a extending in parallel to the first linear electrode LE1 of the first pixel MP1, fourth extension S2b extending in parallel to the second linear electrode LE2 of the second pixel MP2, and second connection S2c connecting the third extension S2a and the fourth extension S2b. The first distance D1a is a distance in the first direction d1 between the first extension S1a and the third extension S2a. The second distance D2a is a distance in the first direction d1 between the second extension S1b and the fourth extension S2b.

The third signal line S3 includes a fifth extension S3a extending in parallel to the first linear electrode LE1 of the third pixel MP3, sixth extension S3b extending in parallel to the second linear electrode LE2 of the fourth pixel MP4, and third connection S3c connecting the first extension S3a and the second extension S3b. The fourth signal line S4 includes a seventh extension S4a extending in parallel to the first linear electrode LE1 of the third pixel MP3, eighth extension S4b extending in parallel to the second linear electrode LE2 of the fourth pixel MP4, and fourth connection S4c connecting the seventh extension S4a and the eighth extension S4b. A distance in the first direction d1 between the fifth extension S3a and seventh extension S4a is the first distance D1a. A distance in the first direction d1 between the sixth extension S3b and the eighth extension S4b is the second distance D2a. Note that, as described above, the first distance D1a is greater than the second distance D2a (D1a>D2a).

The first linear electrode LE1 of the first pixel MP1, the second linear electrode LE2 of the fourth pixel MP4, first extension S1a, third extension S2a, sixth extension S3b, and eighth extension S4b extend in the third direction d3. The second linear electrode LE2 of the second pixel MP2, the first linear electrode LE1 of the third pixel MP3, second extension S1b, fourth extension S2b, fifth extension S3a, and seventh extension S4a extend in the fourth direction d4.

The first signal line S1 bends at the boundary of the first extension S1a and the first connection S1c, the second signal line S2 bends at the boundary of the third extension S2a and the second connection S2c, the third signal line S3 bends at the boundary of the sixth extension S3b and the third connection S3c, and the fourth signal line S4 bends at the boundary of the eighth extension S4b and the fourth connection S4c. In the first direction d1, the positions of the boundaries of the extensions and the connections are matched.

The end of the first connection S1c in the first extension S1a side, the end of the second connection S2c in the third extension S2a side, and the end of the third connection S3c in the sixth extension S3b side extend in a direction inclined with respect to the second direction d2 in the second rotation direction at an acute angle (to the fourth direction d4 side). Note that the end of the fourth connection S4c in the eighth extension S4b side extends in the second direction d2. Since the length of each of the first extension S1a, third extension S2a, and sixth extension S3b can be increased, the areas of the regions R1 to R4 can be increased.

Groups each including six subpixels SP contained in the first pixel MP1 and the fourth pixel MP4 adjacent to each other in the first direction d1 are arranged at even intervals in the first direction d1. Groups each including six subpixels SP contained in the second pixel MP2 and the third pixel MP3 are arranged at even intervals in the first direction d1.

A pitch Pa in the first direction d1 of a pair of signal lines S sandwiching six pixel electrodes PE of each pixel group MPG arranged in the first direction d1 is constant. Here, a pitch Pa which is constant does not only mean that the pitch Pa is completely the same but it also may contain a small difference such that the pitch may differ between 0.9 to 1.1 times.

Furthermore, for example, in the first pixel MP1 and the second pixel MP2, each subpixel SP is, in a plan view, between a pair of signal lines S and a distance between a pair of signal lines S in each subpixel SP is constant. Here, a distance which is constant does not only mean that the gap is completely the same but it also may contain a small difference such that the distance may differ between 0.9 to 1.1 times.

Figure 7:
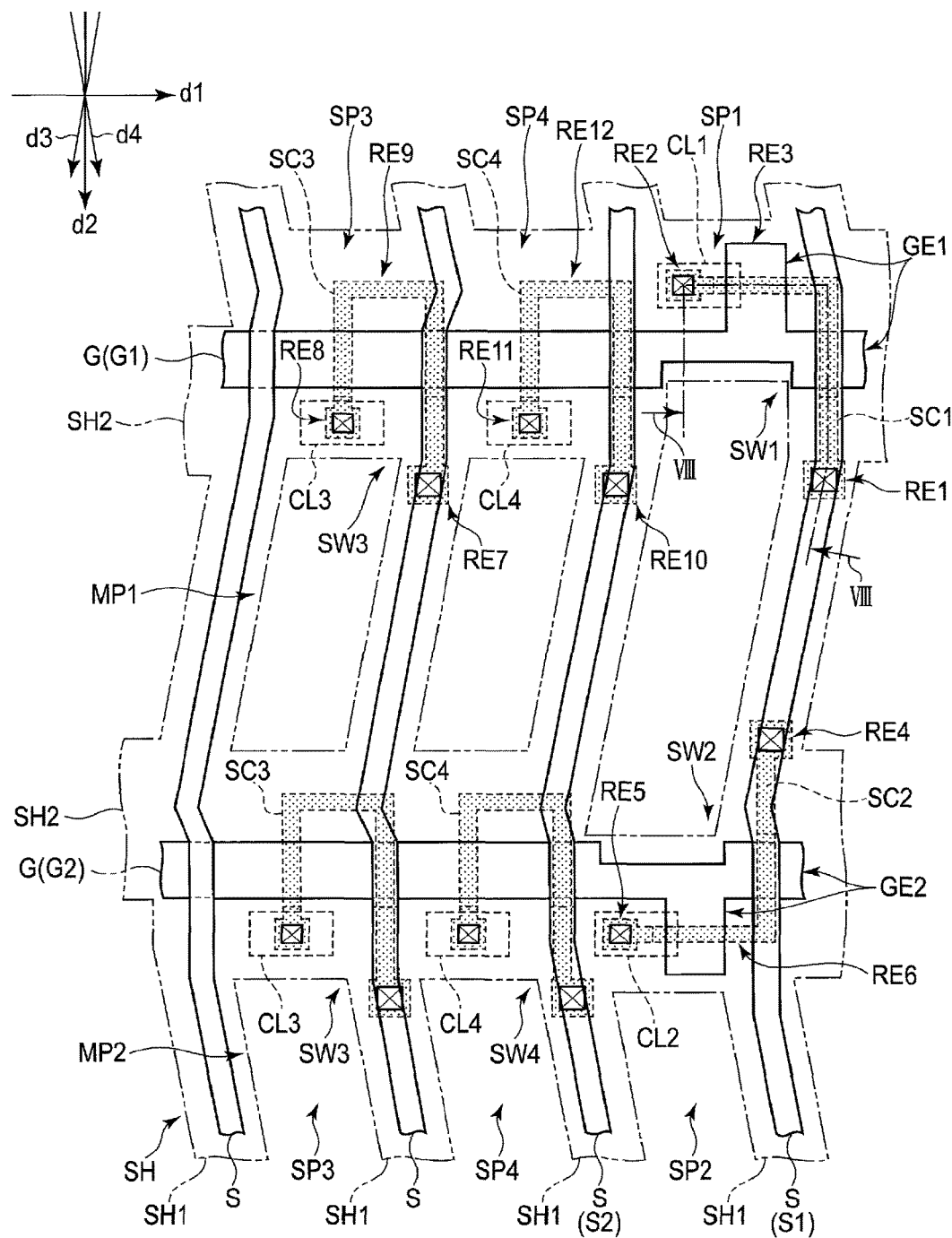
FIG. 7 is an enlarged plan view of a part of two pixels shown in FIG. 6.

FIG. 7 is a plan view showing a part of two pixels MP of FIG. 6 in an enlarged manner. In FIG. 7, the first pixel MP1 and the second pixel MP2 are shown. Note that the depiction of a pixel electrode is omitted. In the figure, in the scanning lines G, the upper scanning line G is referred to as first scanning line G1, and the lower scanning line G is referred to as second scanning line G2. The first scanning line G1 and the second scanning line G2 extend in the first direction d1 and are disposed to be apart from each other.

As shown in FIG. 7, each subpixel SP includes a conductive layer CL. In a plan view, the entire conductive layers CL are covered with the light shielding layer SH. The first subpixel SP1 includes a conductive layer CL1, second subpixel SP2 includes a conductive layer CL2, third subpixel SP3 includes a conductive layer CL3, and fourth subpixel SP4 includes a conductive layer CL4. In the conductive layers CL of the first pixel MP1, the conductive layer CL1 is disposed above a first main part of the first scanning line G1 extending in the first direction d1, and the conductive layers CL3 and CL4 are disposed below the first main part of the first scanning line G1. Thus, a position where the first pixel electrode PE1 contacts the conductive layer CL1 in the first pixel MP1 is above the first main part of the first scanning line G1, and a position where the third pixel electrode PE3 contacts the conductive layer CL3 and a position where the fourth pixel electrode PE4 contacts the conductive layer CL4 are below the first main part of the first scanning line G1.

On the other hand, the conductive layers CL2, CL3, and CL4 of the second pixel MP2 are disposed below a second main part of the second scanning line G2 extending in the first direction d1. Thus, a position where the second pixel electrode PE2 contacts the conductive layer CL2 in the second pixel MP2, a position where the third pixel electrode PE3 contacts the conductive layer CL3, and a position where the fourth pixel electrode PE4 contacts the conductive layer CL4 are below the second main part of the second scanning line G2.

Each switching element SW includes a semiconductor layer SC. The semiconductor layer SC crosses a scanning line G at two points. Thus, the switching element SW is each formed as a double gate thin film transistor. Note that, unlike the present embodiment, the semiconductor layer SC may cross a scanning line G at one point or at three points.

The first switching element SW1 is a first thin film transistor which includes a first semiconductor layer SC1 and a first gate electrode GE1. The first semiconductor layer SC1 includes a first electrode region RE1 connected to a first signal line S1, second electrode region RE2 connected to a conductive layer CL1 (first pixel electrode PE1), and third electrode region RE3 disposed between the first electrode region RE1 and the second electrode region RE2 to overlap the first scanning line G1. In a plan view where the first scanning line C1 is disposed above and the second scanning line G2 is disposed below, the first semiconductor layer SC1 (third electrode region RE3) is formed such that a letter L is rotated 180 degrees.

The first gate electrode GE1 is a part of the first scanning line G1 and is opposed to the third electrode region RE3. In the present embodiment, the first main part of the first scanning line G1 is used for one side of the first gate electrode GE1 and the first branch branching from the first main part is used for the other side thereof. The first semiconductor layer SC1 overlaps the first main part and the first branch.

The second switching element SW2 is a second thin film transistor which includes a second semiconductor layer SC2 and a second gate electrode GE2. The second semiconductor layer SC2 includes a fourth electrode region RE4 connected to a first signal line S1, fifth electrode region RE5 connected to a conductive layer CL2 (second pixel electrode PE2), and sixth electrode region RE6 disposed between the fourth electrode region RE4 and the fifth electrode region RE5 to overlap the second scanning line G2. In a plan view where the first scanning line G1 is above and the second scanning line G2 is below, the second semiconductor layer SC2 (sixth electrode region RE6) is formed such that a letter L is reversed horizontally.

The second gate electrode GE2 is a part of the second scanning line G2 and is opposed to the sixth electrode region RE6. In the present embodiment, the second main part of the second scanning line G2 is used for one side of the second gate electrode GE2 and the second branch branching from the second main part is used for the other side thereof. The second branch extends in the opposite direction of the extension direction of the first branch. The second semiconductor layer SC2 overlaps the second main part and the second branch.

The third switching element SW3 is a third thin film transistor which includes a third semiconductor layer SC3 and a third gate electrode GE3. The third semiconductor layer SC3 includes a seventh electrode region RE7 connected to a signal line S, eighth electrode region RE8 connected to a conductive layer CL3 (third pixel electrode PE3), and ninth electrode region RE9 disposed between the seventh electrode region RE7 and the eighth electrode region RE8 to overlap the scanning line G. For example, the third semiconductor layer SC3 of the first pixel MP1 overlaps the first main part of the first scanning line G1 at two points.

The fourth switching element SW4 is a fourth thin film transistor which includes a fourth semiconductor layer SC4 and a fourth gate electrode GE4. The fourth semiconductor layer SC4 includes a tenth electrode region RE10 connected to a signal line S, eleventh electrode region RE11 connected to a conductive layer CL4 (fourth pixel electrode RE4), and twelfth electrode region RE12 disposed between the tenth electrode region RE10 and the eleventh electrode region RE11 to overlap the scanning line G. For example, the fourth semiconductor layer SC4 of the first pixel MP1 overlaps the first main part of the first scanning line G1 at two points.

In a plan view where the first scanning line C1 is above and the second scanning line G2 is below, the third semiconductor layer SC3 (ninth electrode region RE9) and the fourth semiconductor layer SC4 (twelfth electrode region RE12) of the first pixel MP1 each cross the first scanning line G1 and are formed such that a letter U is reversed vertically. In the plan view, the third semiconductor layer SC3 (ninth electrode region RE9) and the fourth semiconductor layer SC4 (twelfth electrode region RE12) of the second pixel MP2 each cross the second scanning line G2 and are formed such as a letter U is reversed vertically.

As shown in FIGS. 7 and 6, here, the second electrode region RE2 and the fifth electrode region RE5 are disposed outside the area (first area) surrounded by the first signal line S1, second signal line S2, first scanning line G1, and second scanning line G2. Note that the conductive layer CL1 and the conductive layer CL2 are disposed outside the above area. Thus, the ratio of area of the first color (blue) region R1 can be increased.

Note that, in the present embodiment, the semiconductor layer SC is formed of a polycrystalline silicon. However, unlike the present embodiment, the semiconductor layer SC may be formed of a semiconductor other than a polycrystalline silicon such as an oxide semiconductor.

Figure 8:
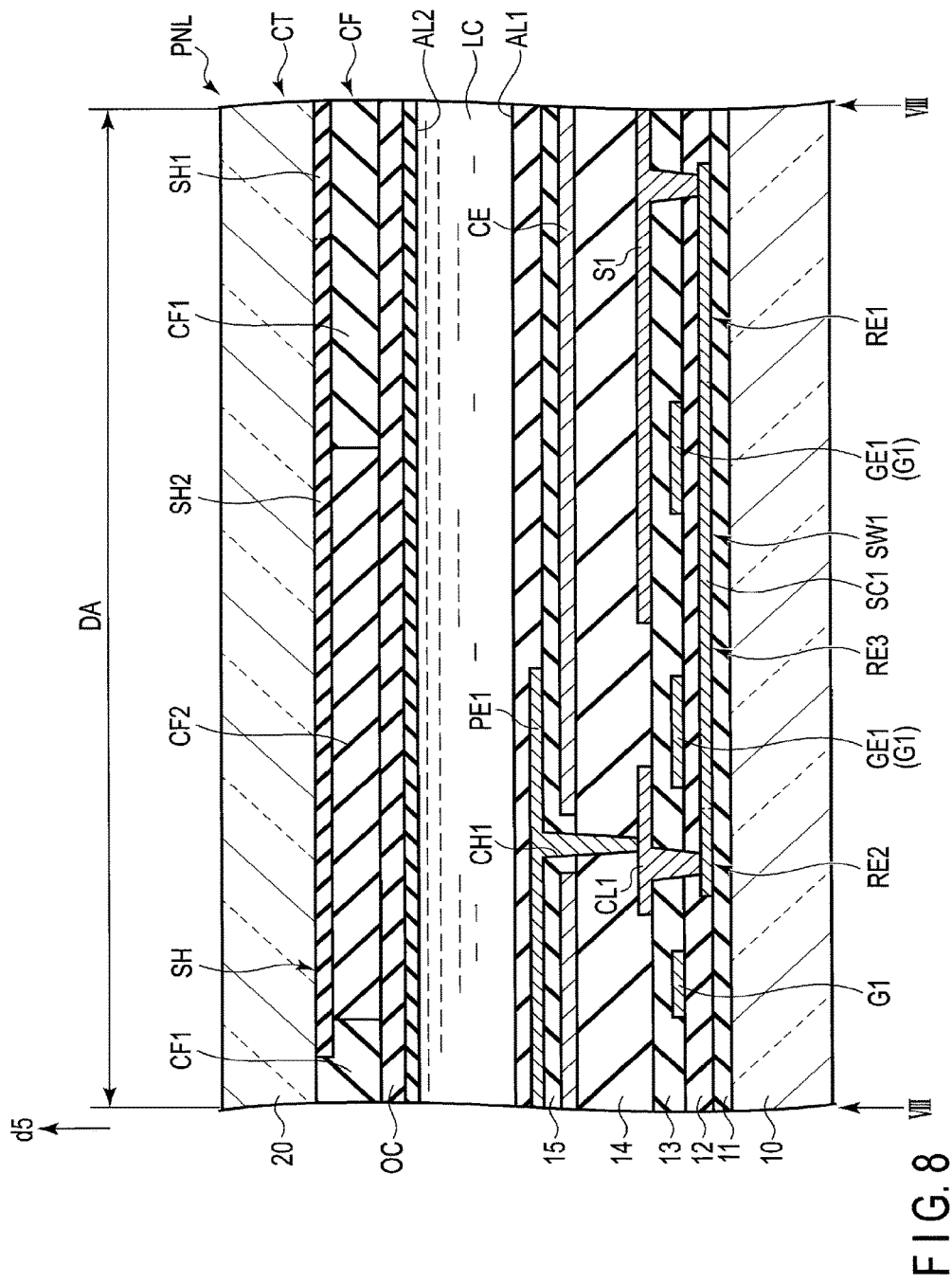
FIG. 8 is a cross-sectional view of the liquid crystal display panel, taken along line VIII-VIII in FIG. 7.

FIG. 8 is a cross-sectional view of the liquid crystal display panel of FIG. 7, taken along line VIII-VIII of FIG. 7. As shown in FIG. 8, the array substrate AR is formed using a light transmissive first insulating substrate 10 such as a glass substrate or a resin substrate. The array substrate AR includes, for example, an insulating film 11, insulating film 12, insulating film 13, insulating film 14, insulating film 15, first switching element SW1, first scanning line G1, first signal line S1, first pixel electrode PE1, common electrode CE, and first alignment film AL1. In the figure depicted, the first switching element SW1 has a top gate structure. Note that, unlike the present embodiment, each switching element SW may has a bottom gate structure.

The insulating film 11 is formed on the first insulating substrate 10. The first semiconductor layer SC1 of the first switching element SW1 is formed on the insulating film 11. The insulating film 12 is formed on the insulating film 11 and the first semiconductor layer SC1. The first scanning line G1 is formed on the insulating film 12. The first gate electrode GE1 is opposed to the third electrode region RE3.

The insulating film 13 is formed on the first scanning line G1 and the insulating film 12. The first signal line S1 and the conductive layer CL1 are formed on the insulating film 13. The first signal line S1 is in contact with the first electrode region RE1 of the first semiconductor layer SC1 through a contact hole passing through the insulating film 12 and the insulating film 13. The conductive layer CL1 is in contact with contacts the second electrode region RE2 of the first semiconductor layer SC1 through another contact hole passing through the insulating film 12 and the insulating film 13.

The insulating film 14 is formed on the insulating film 13, first signal line S1, and conductive layer CL1. The common electrode CE is formed on the insulating film 14. The insulating film 15 is formed on the insulating film 14 and the common electrode CE. Insulative materials used for the insulating films 11 to 15 are not limited specifically. For example, the insulating films 11, 12, 13, and 15 are formed of inorganic materials such as silicon nitride (SiN) or silicon oxide (silicon oxide). The insulating film 14 is formed of an organic material such as an acrylic resin.

The first pixel electrode PE1 is formed on the insulating film 15. The first pixel electrode PE1 is in contact with the conductive layer CL1 through a contact hole CH1 passing through the insulating film 14 and the insulating film 15. The common electrode CE and the pixel electrode PE (linear electrode LE) are formed of a conductive material. For example, the common electrode CE and the pixel electrode PE are formed of a transparent conductive material such as indium zinc oxide (IZO) or indium tin oxide (ITO). The first alignment film AL1 is formed on the insulating film 15 and the pixel electrode PE.

The counter substrate CT is formed using a light transmissive second insulating substrate 20 such as a glass substrate or a resin substrate. The counter substrate CT includes a light shielding layer SH, color filter CF, overcoat layer OC, and second alignment layer AL2. The color filter CF includes a plurality of color filters of different colors, shapes, and sizes.

The light shielding layer SH includes a first extension SH1 opposed to the first signal line S1 and a second extension SH2 opposed to the first scanning line G1.

The color filters CF1 and CF2 overlap the light shielding layer SH at their ends. The overcoat layer OC is formed of a transparent resin material and covers color filters CF such as color filters CF1 and CF2. The second alignment film AL2 is formed on the overcoat layer OC in the side opposed to the array substrate AR.

Note that, in the example depicted, the color filter CF is formed on the counter substrate CT; however, it may be formed on the array substrate AR. Furthermore, in the color filters CF formed, a color filter CF2 may be omitted.

The liquid crystal display device DSP of the present embodiment is formed as above.

As structured above according to an embodiment, the liquid crystal display device DSP includes the first signal line S1, second signal line S2 arranged in the first direction d1 to be apart from the first signal line S1, first pixel electrode PE1 disposed between the first signal line S1 and the second signal line S2, and second pixel electrode PE2 disposed between the first signal line S1 and the second signal line S2 to be adjacent to the first pixel electrode PE1. The first distance D1a between the first signal line S1 and the second signal line S2 passing the center of the first pixel electrode PE1 in the second direction d2 is greater than the second distance D2a between the first signal line S1 and the second signal line S2 passing the center of the second pixel electrode PE2 in the second direction d2.

Since the ratio of the area of the first color (blue) region R1 can be increased, the light transmissivity of the region R1 can be increased, and it helps lower power consumption of the device. When the first width of the region R1 is increased, the second width of the second color (white) region R2 is prevented from increasing together. The third width of the third color (red) region R3 and the fourth width of the fourth color (green) region R4 are prevented from decreasing. Thus, the liquid crystal display device DSP in which the widths of subpixels SP are arranged along the signal lines S can be adjusted can be achieved.

Furthermore, as described above, the layout of the first semiconductor layer SC1, conductive layer CL1, contact hole CH1, second semiconductor layer SC2, and conductive layer CL2 is adjusted, and contact hole through which the second pixel electrode PE2 contacts the conductive layer CL2 is positioned above the conductive layer CL2, and therefore, the length of the region R1 can be increased than the length of the region R2 in the second direction d2. Thereby, the area of the region R1 can be increased while the region R2 can be relatively decreased.

As can be understood from the above, the liquid crystal display device DSP in which the size of subpixels SP can be adjusted can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 9:
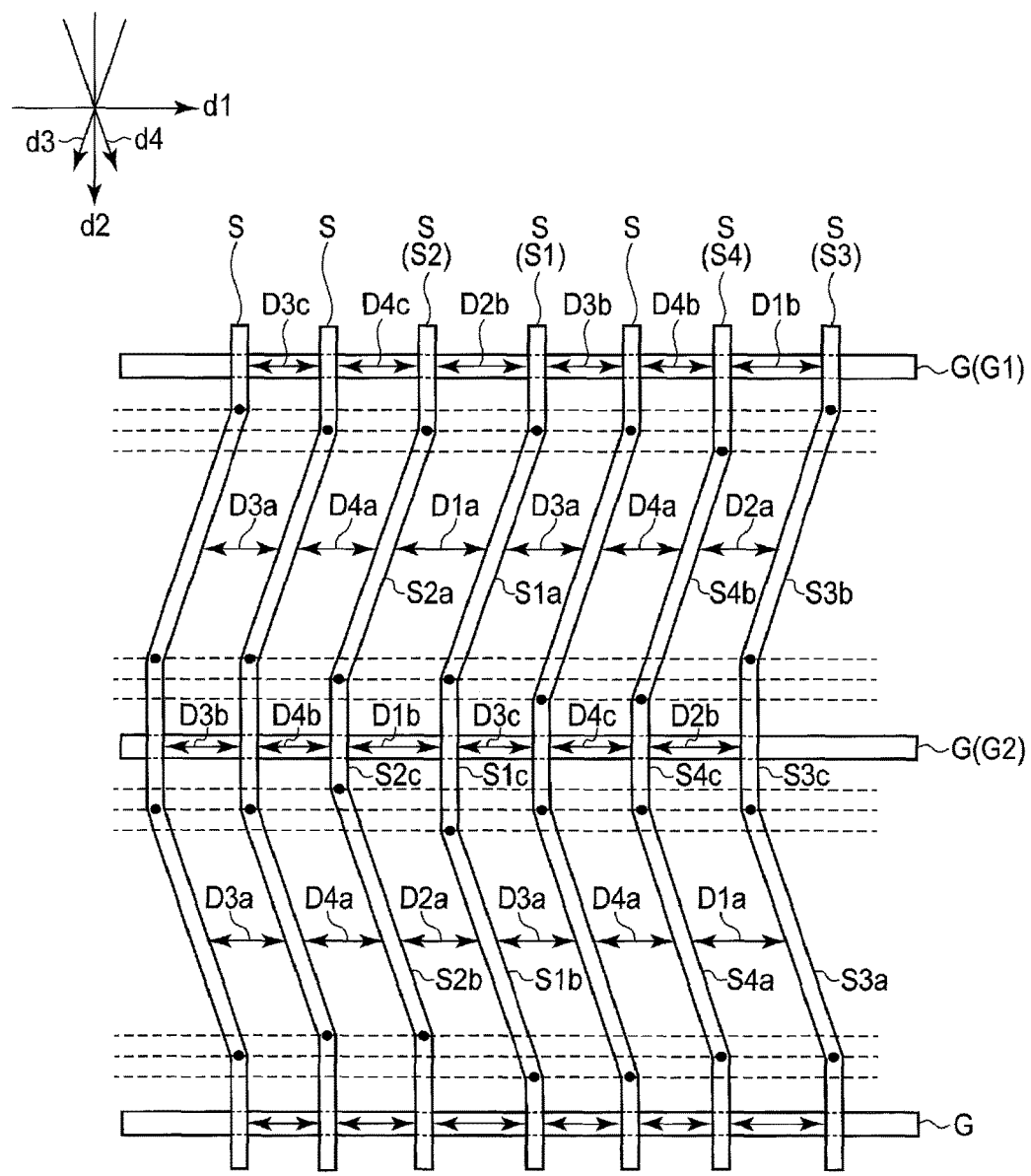
FIG. 9 is a plan view showing scanning lines and signal lines of a liquid crystal display panel of a variation of the embodiment.

For example, as shown in FIG. 9, the position of the boundary between the extensions and connections may not be matched in the first direction d1 unlike the above embodiment (shown in FIG. 6). Each connection extends linearly in the second direction d2. The first distance D1$a$ is greater than the second distance D2$a$ (D1$a$>D2$a$). Here, a distance in the first direction d1 between signal lines S passing the center of the third pixel electrode PE3 in the second direction d2 is a third distance D3$a$, and a distance in the first direction d1 between signal lines S passing the center of the fourth pixel electrode PE4 in the second direction d2 is a fourth distance D4$a$. As long as the first distance D1$a$ is greater than the second distance D2$a$, the relationship between the gaps D1$a$ to D4$a$ is not limited specifically. Note that, in the variation shown in FIG. 9, the relationship is D3$a$<D4$a$<D2$a$<D1$a$.

Furthermore, a pitch in the first direction d1 between signal lines S passing the center of the pixel electrode PE in the second direction d2 is different from a pitch in the first direction d1 between signal lines S in an area overlapping scanning lines G. Here, distances in the first direction d1 between signal lines S in the area overlapping the scanning lines G are a fifth distance D1$b$, sixth distance D2$b$, seventh distance D3$b$, eighth distance D3$c$, ninth distance D4$b$, and tenth distance D4$c$. For example, the fifth distance D1$b$ is a distance between the signal lines S in the area overlapping the scanning lines G below the first pixel electrode PE1. Furthermore, the sixth distance D2$b$ is a distance between the signal lines S in the area overlapping the scanning lines G below the second pixel electrode PE2.

The relationship between the fifth to tenth distances D1$b$ to D4$c$ are not limited specifically. Note that, in this variation, D3$c$<D4$b$<D3$b$<D4$c$<D1$b$=D2$b$. Furthermore, D1$a$=D3$b$ and D4$a$=D4$c$.

As described above, the first distance D1$a$ is greater than the second distance D2$a$ in the variation, and thus, the above advantages can be achieved as well. The first direction d1 and the second direction d2 are not limited to the above embodiments and may be varied arbitrarily. For example, in a plan view of FIG. 3, the first direction d1 may go left and the second direction d2 may go up.

The liquid crystal display panel PNL of the above embodiments corresponds to an FFS mode which is one of in-plane switching (IPS) modes using a horizontal field for image display; however, it may correspond to other display modes. For example, an ordinary IPS mode in which the array substrate AR includes both linear pixel electrodes PE and linear common electrode CE, or a mode where the array substrate AR includes linear or flat surface pixel electrodes PE and the counter substrate CT includes the common electrode CE can be adopted.

The above embodiments can be applied to not only a liquid crystal display device but also other display devices such as an organic electroluminescent display device. The above embodiments can be applied to any size of display device including small to medium display devices and large display devices.

What is claimed is:

1. A display device, comprising:
a first signal line;
a second signal line arranged in a first direction to be apart from the first signal line;
a first scanning line;
a second scanning line and a third scanning line arranged in a second direction which crosses the first direction to be apart from the first scanning line;
a first subpixel including a first pixel electrode and a second subpixel including a second pixel electrode; and
a light shielding layer including a plurality of openings, wherein an area, in a plan view, surrounded by the first signal line, the second signal line, the first scanning line, and the second scanning line and including the first pixel electrode is a first area,
an area, in a plan view, surrounded by the first signal line, the second signal line, the second scanning line, and the third scanning line and including the second pixel electrode is a second area,
a first opening of the openings overlaps the first area,
a second opening of the openings overlaps the second area,
the first area has a first distance in the first direction, wherein the first distance is a gap between the first signal line and the second signal line in the first direction passing through a center part of the first area in the second direction,
the second area has a second distance in the first direction, wherein the second distance is a gap between the first signal line and the second signal line in the first direction passing through a center part of the second area in the second direction,
the first opening has a third distance of the first area in the second direction passing through a center part of the first area in the first direction,
the second opening has a fourth distance of the second area in the second direction passing through a center part of the second area in the first direction,
the first distance is greater than the second distance, and
the third distance is greater than the fourth distance.

2. The display device of claim 1, wherein
the light shielding layer includes a first light shielding portion overlapping the first scanning line, a second light shielding portion overlapping the second scanning line, and a third light shielding portion overlapping the third scanning line,
the third distance is a gap between the first light shielding portion and the second light shielding portion in the second direction, and
the fourth distance is a gap between the second light shielding portion and the third light shielding portion in the second direction.

3. The display device of claim 2, wherein the first subpixel is a subpixel of a first color,
the second subpixel is a subpixel of a second color,
the first color is blue and has a wavelength of 380 or more and less than 490 nm, and
the second color is white.

4. The display device of claim 2, further comprising:
a plurality of first main pixels and a plurality of second main pixels arranged in the first direction and the second direction,
wherein
each of the first main pixels includes the first subpixel, a third subpixel, and a fourth subpixel, wherein the first subpixel, the third subpixel, and the fourth subpixel are arranged in the first direction,
each of the second main pixel includes the second subpixel, the third subpixel, and the fourth subpixel, wherein the second subpixel, the third subpixel, and the fourth subpixel are arranged in the first direction,
groups each including six subpixels contained in the first main pixel and the second main pixel adjacent in the first direction are arranged at even intervals in the first direction,
the openings have a third opening and a fourth opening, wherein the third opening overlaps the third subpixel, and the fourth opening overlaps the fourth subpixel, an area of the first opening is larger than each of an area of the third opening and an area of the fourth opening, the area of the third opening and the area of the fourth opening are larger than an area of the second opening, and the area of the third opening and the area of the fourth opening are substantially the same.

5. The display device of claim 4, further comprising:

a plurality of signal lines including the first signal line and the second signal line, wherein each subpixel in the first main pixel and the second main pixel is disposed between a pair of signal lines in a plan view, and the pair of signal lines are arranged at even intervals with respect to each subpixel.

6. The display device of claim 4, wherein the first subpixel is a subpixel of a first color, the second subpixel is a subpixel of a second color, the third subpixel is a subpixel of a third color, the fourth subpixel is a subpixel of a fourth color, the first color is blue and has a wavelength of 380 or more and less than 490 nm, the second color is white, the third color is red and has a wavelength of 590 or more and less than 780 nm, and the fourth color is green and has a wavelength of 490 or more and less than 590 nm.

7. The display device of claim 2, wherein the first signal line includes a first extension extending in parallel to a first linear electrode of the first pixel electrode, a second extension extending in parallel to a second linear electrode of the second pixel electrode, and a first connection connecting the first extension and the second extension, and the second signal line includes a third extension extending in parallel to the first linear electrode, a fourth extension extending in parallel to the second linear electrode, and a second connection connecting the third extension and the fourth extension.

8. The display device of claim 7, wherein the first signal line is bent at a boundary between the first extension and the first connection, and the second signal line is bent at a boundary between the third extension and the second connection.

9. The display device of claim 8, wherein a direction inclined at an acute angle in a first rotation direction with respect to the second direction is a third direction, a direction inclined at an acute angle in a second rotation direction which is counter to the first rotation direction with respect to the second direction is a fourth direction, the first linear electrode, the first extension, and the third extension extend in the third direction, the second linear electrode, the second extension, and the fourth extension extend in the fourth direction, and the first connection and the second connection extend in the second direction.

10. The display device of claim 9, wherein an end of the first connection in the first extension side extends in a direction inclined at an acute angle in the second rotation direction from the second direction, and an end of the second connection in the third extension side extends in a direction inclined at an acute angle in the second rotation direction from the second direction.

11. The display device of claim 1, further comprising:

a first semiconductor layer including a first electrode region connected to the first signal line, a second electrode region connected to the first pixel electrode, and a third electrode region disposed between the first electrode region and the second electrode region overlapping the first scanning line; and a second semiconductor layer including a fourth electrode region connected to the first signal line, a fifth electrode region connected to the second pixel electrode, and a sixth electrode region disposed between the fourth electrode region and the fifth electrode region overlapping the second scanning line, wherein the second electrode region and the fifth electrode region are disposed outside the first area.

12. The display device of claim 11, wherein the first scanning line includes a first main part extending in the first direction and a first branch branching from the first main part, the second scanning line includes a second main part extending in the first direction and a second branch branching from the second main part, the second branch extends in the opposite direction of the extending direction of the first branch, the first semiconductor layer overlaps the first main part and the first branch, and the second semiconductor layer overlaps the second main part and the second branch.

13. The display device of claim 12, further comprising:

a third semiconductor layer, wherein the third semiconductor layer overlaps the first main part of the first scanning line at two points.

14. The display device of claim 4, wherein the first pixel electrode is longer than the second pixel electrode in the second direction.

15. The display device of claim 14, wherein the third subpixel has a third pixel electrode, the fourth subpixel has a fourth pixel electrode, and the third pixel electrode and the forth pixel electrode have substantially the same length in the second direction.

16. The display device of claim 15, wherein the first pixel electrode is longer than the third pixel electrode in the second direction, and the fourth pixel electrode is longer than the second pixel electrode in the second direction.

* * * * *